(12) United States Patent
Weiner

(10) Patent No.: US 7,002,386 B2
(45) Date of Patent: Feb. 21, 2006

(54) SELF-LIMITING PULSE WIDTH MODULATION REGULATOR

(75) Inventor: Albert S. Weiner, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/022,098

(22) Filed: Dec. 22, 2004

(65) Prior Publication Data

US 2005/0134243 A1 Jun. 23, 2005

Related U.S. Application Data

(62) Division of application No. 10/639,078, filed on Aug. 11, 2003.

(51) Int. Cl.
*H03K 3/017* (2006.01)
(52) U.S. Cl. ..................... 327/176; 327/299
(58) Field of Classification Search ........ 327/172–176, 327/299, 114–117; 377/47–50
See application file for complete search history.

(56) References Cited

U.S. PATENT DOCUMENTS

| | | | | |
|---|---|---|---|---|
| 5,059,818 A * | 10/1991 | Witt et al. | .................. | 327/175 |
| 5,220,272 A | 6/1993 | Nelson | ........................ | 323/282 |
| 5,363,066 A | 11/1994 | Chen et al. | .................... | 331/17 |
| 5,566,129 A | 10/1996 | Nakashima et al. | ...... | 365/233.5 |
| 5,610,803 A | 3/1997 | Malik | ........................ | 363/21.09 |
| 5,614,870 A | 3/1997 | Sauer et al. | ................... | 331/14 |
| 5,841,305 A * | 11/1998 | Wilson | ........................ | 327/175 |
| 5,903,197 A | 5/1999 | Kikugawa | ..................... | 331/17 |
| 6,064,250 A | 5/2000 | Proebsting | .................... | 327/536 |
| 6,154,411 A | 11/2000 | Morishita | ..................... | 365/226 |
| 6,268,751 B1 * | 7/2001 | Chen et al. | ................... | 327/175 |
| 6,300,839 B1 | 10/2001 | Bazargan et al. | ............. | 331/57 |
| 6,320,437 B1 | 11/2001 | Ma | ............................ | 327/175 |
| 6,404,840 B1 * | 6/2002 | Sindalovsky | .................. | 377/48 |
| 6,430,070 B1 | 8/2002 | Shi et al. | ...................... | 363/97 |
| 2002/0093391 A1 | 7/2002 | Ishida et al. | ................. | 332/109 |

* cited by examiner

*Primary Examiner*—Minh Nguyen
(74) *Attorney, Agent, or Firm*—Sawyer Law Group LLP

(57) ABSTRACT

A self-adjusting PWM regulator which minimizes undershoot and overshoot conditions is disclosed. The regulator includes a charge pump, a voltage comparator circuit, and a latch circuit. The input of the voltage comparator circuit includes an output of the charge pump. The input of the latch circuit includes an output from the voltage comparator circuit. The latch circuit includes a pair of SR latches coupled to a pair of AND/OR gates. The latch circuit transmits a first signal to the charge pump to prevent an overshoot condition if the output from the voltage comparator circuit is in a first state, and transmits a second signal to prevent an undershoot condition if the output from the voltage comparator circuit is in a second state. This keeps the charge pump adjusted within the limits of its control.

13 Claims, 8 Drawing Sheets

SELF-LIMITING PULSE WIDTH MODULATION REGULATOR

CROSS-REFERENCE TO RELATED APPLICATIONS

The present invention is a Divisional application of U.S. application Ser. No 10/639,078, entitled "Self-Limiting Pulse Width Modulation Regulator" filed on Aug. 11 2003, and incorporated herein by reference.

FIELD OF THE INVENTION

The present invention relates to pulse width modulation regulators, and more particularly to the minimizing of undershoot and overshoot conditions in pulse width modulation regulators.

BACKGROUND OF THE INVENTION

FIG. 1 illustrates a conventional pulse width modulation (PWM) regulator. The regulator (10) comprises a variable delay generator (40), an inverter (42), and an AND gate (44). The variable delay generator (40) received a dischg signal (138) and an up_down_ctrl signal (132), as input, and outputs a comp_out signal (136). The AND gate (44) receives a clock signal (11) and an inverted comp_out signal as inputs.

Assuming a 50—50 duty clock cycle, the comp_out signal (136) is low at the beginning of the cycle. When the clock signal (11) goes high, the output (12) goes high. Once the comp_out signal (136) goes high, the AND gate (44) brings the output (12) low. Thus, the width of the high pulse is controlled by the delay between the clock signal (11) going high and the comp_out signal (136) going high.

FIG. 2 illustrates a conventional variable delay generator of the PWM regulator (10). The generator (40) comprises a charge pump (50) and a voltage comparator circuit (55). A "charge pump", as used in this specification, refers to a circuit comprising a relatively large capacitor whose voltage is moved up or down by injection of a relatively small positive or negative current. The charge pump (50) comprises transistors, M1–M7 (104–116), and a filter capacitor C1 (120). Transistors M1–M5 (104–112) are matched transistors that form a group of current mirrors. A small current (represented by the current source 102) is produced in M2 (106) and M5 (112). These currents are gated by M6 (114) and M7 (116). When the up_down_ctrl signal (132), is high, M6 (114) is "off" and M7 (116) is "on". This pulls a small current from C1 (120), thus the voltage at node pgate drops slowly. Conversely, when the up_down_ctrl signal (132) is low, M6 (114) is "on" and M7 (116) is "off", and the current flows from VDD into C1 (120). The voltage on node pgate (130) thus rises slowly. Therefore, the up_down_ctrl signal (132) is translated into a small change in the charge pump's node output.

The voltage comparator circuit (55) comprises a transistor M8 (118), a capacitor C2 (122), a reset circuit represented by transistor M9 (124), and a comparator represented by voltage sources (126 and 128). The voltage comparator circuit (55) uses the voltage on node pgate (130) to produce a current related to that voltage and translates it into a delay time. The gate of M8 (118) is connected to node pgate (130) such that an increase in the voltage on node pgate (130) causes a reduction in the current that flows into C2 (122). A decrease in the voltage on node pgate (130) increases the current that flows into C2 (122). The current in C2 (122) thus rises at a rate proportional to the current in M8 (118). The comparator detects when the voltage at node ramp (134) reaches a predefined level and generates the comp_out signal (136). The dischg signal (138) resets the voltage at node ramp (134). Once the dischg signal (138) goes low, the voltage at node ramp (134) will begin to rise again. In this way, a pulse may be produced at the output (12) whose width is dependent on the voltage on node pgate (130). If the voltage on node pgate (130) is close to VDD, such that there is very little current in M8 (118), the node ramp (134) will not rise at all. As M8 (118) conducts more current, the rise time on node ramp (134) is reduced, and the comp_out signal (136) goes high with little delay. The output (12) goes low once more when the dischg signal (138) is asserted. In this manner, the voltage at node pgate (130) controls the width of the output pulse.

However, the regulator (10) is prone to the "saturation condition", where the voltage at the node pgate (130) undershoots or overshoots the target voltage. In the regulator (10), the dischg signal (138) is a clock signal with a 50% duty cycle. When the dischg signal (138) is high, the node ramp (134) is held low and the regulator output (12) is also low. During the other half of the cycle, when the dischg signal (138) is low, the voltage on node ramp (134) may rise. If it rises too slowly, such that the voltage on node ramp (134) does not reach the comparator trip point before the dischg signal goes high, there will be no pulse on the output. This will happen if the voltage on node pgate (130) is greater than approximately VDD-Vt, where Vt is the threshold voltage of M8 (118). However, if the up_down_ctrl signal (132) remains low, the charge pump (50) will continue to pull up the voltage on node pgate (130) until it reaches VDD. This is an overshoot condition. When the up_down_ctrl signal (132) goes high again, the voltage on node pgate (130) will take a relatively long time to reach VDD-Vt, when it will begin affecting pulse width. The time during which node pgate (130) is dropping to the voltage at which it affects operation represents a period when the regulator (10) does not respond to the input signal.

Similarly, the voltage at node pgate (130) can fall too far. In this case, the comparator output will go high immediately and the output pulse (12) will be essentially unmodulated. However, the voltage on node pgate (130) can continue to fall, creating an undershoot condition. Both overshoot and undershoot conditions compromise the performance and reliability of the regulator (10).

Accordingly, there exists a need for a PWM regulator which minimizes undershoot and overshoot conditions. The present invention addresses such a need.

SUMMARY OF THE INVENTION

A self-adjusting PWM regulator which minimizes undershoot and overshoot conditions is disclosed. The regulator includes a charge pump, a voltage comparator circuit, and a latch circuit. The input of the voltage comparator circuit includes an output of the charge pump. The input of the latch circuit includes an output from the voltage comparator circuit. The latch circuit includes a pair of SR latches coupled to a pair of AND/OR gates. The latch circuit transmits a first signal to the charge pump to prevent an overshoot condition if the output from the voltage comparator circuit is in a first state, and transmits a second signal to prevent an undershoot condition if the output from the voltage comparator circuit is in a second state. This keeps the charge pump adjusted within the limits of its control.

Also, the latch circuit keeps the regulator automatically adjusted to changes in voltage, temperature, frequency or processing of the regulator.

DETAILED DESCRIPTION

The present invention provides a Pulse Width Modulation (PWM) regulator which minimizes undershoot and overshoot conditions. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 through 8 in conjunction with the discussion below.

Figure 1:
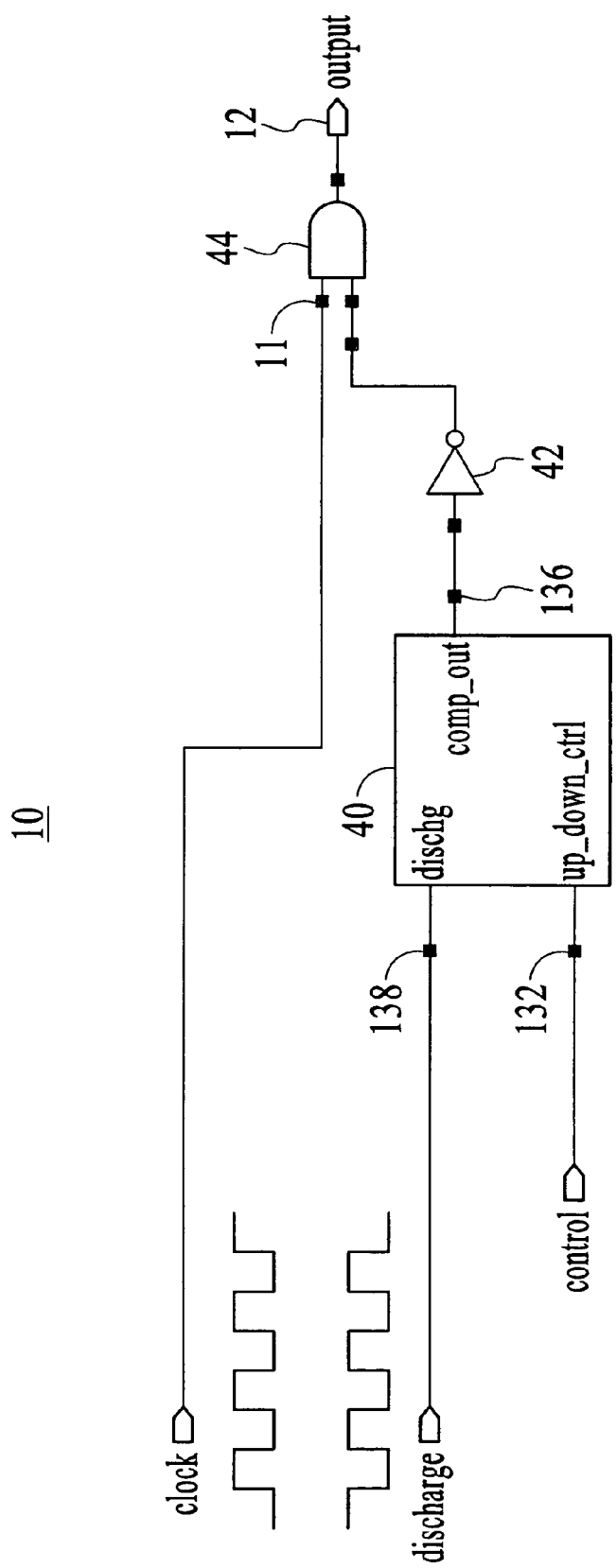
FIG. 1 illustrates a conventional pulse width modulation (PWM) regulator.
Figure 3:
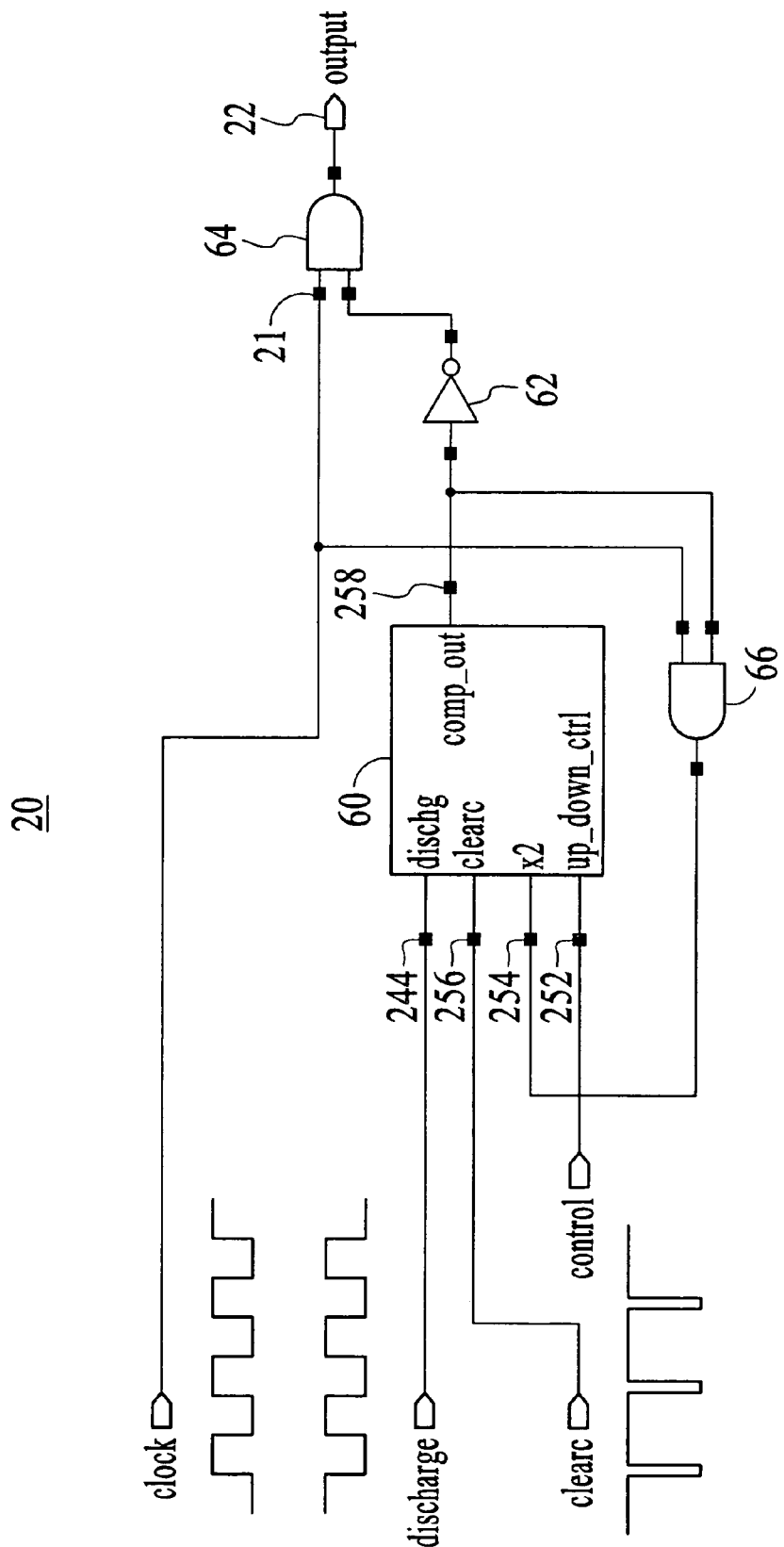
FIG. 3 illustrates an embodiment of the PWM regulator in accordance with the present invention.

FIG. 3 illustrates an embodiment of the PWM regulator in accordance with the present invention. The regulator (20) comprises a variable delay generator (60), an inverter (62), an AND gate (64), and a NAND gate (66). The variable delay generator (60) receives as input a dischg signal (244), an up_down_ctrl signal (252), a clearc signal (254), and an x2 signal (256), and outputs a comp_out signal (258). The AND gate (64) receives the inverted comp_out signal and a clock signal (21) as inputs. The comp_out signal (258) and the clock signal (21) are inputting to the NAND gate (66) to provide the x2 signal (254). The dischg signal (244) and the up_down_ctrl signal (252) have the same functions as with the conventional regulator (10) (FIG. 1). The x2 (254) and clearc (256) signals are described later below.

Figure 4:
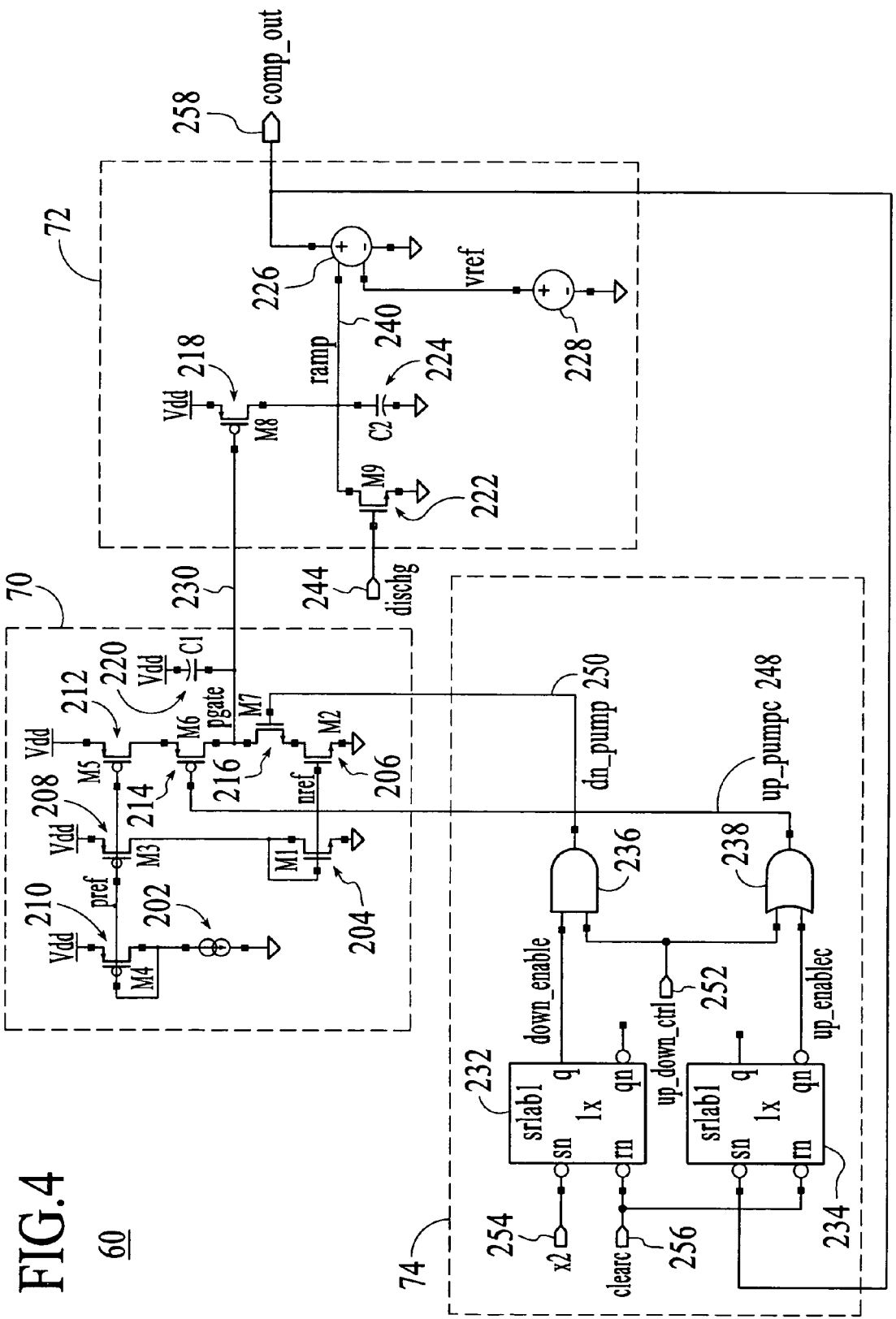
FIG. 4 illustrates an embodiment of the variable delay generator of the PWM regulator in accordance with the present invention

FIG. 4 illustrates an embodiment of the variable delay generator for the PWM regulator in accordance with the present invention. The generator (60) comprises a charge pump (70), a voltage comparator circuit (72), and a latch circuit (74). The charge pump (70) comprises transistors, M1–M7 (204–216) and a filter capacitor C1 (220). Transistors M1–M5 (204–212) are matched transistors that form a group of current mirrors. A small current (represented by the current source 202) is produced in M2 (206) and M5 (212). These currents are gated by M6 (214) and M7 (216).

The voltage comparator circuit (72) comprises a transistor M8 (218), a capacitor C2 (224), a clock circuit represented by transistor M9 (222), and a comparator represented by voltage sources (226, 228). The voltage comparator circuit (72) uses the voltage on node pgate (230) to produce a current related to that voltage and translates it into a delay time. The gate of M8 (218) is connected to node pgate (230) such that an increase in the voltage on node pgate (230) causes a reduction in the current that flows into C2 (224). A decrease in the voltage on node pgate (230) increases the current that flows into C2 (224). The current in C2 (224) thus rises at a rate proportional to the current in M8 (218). The comparator detects when the voltage at node ramp (240) reaches a predefined level and generates a comp_out signal (242). The dischg signal (244) resets the voltage at node ramp (240), and, once the dischg signal (244) goes low, the voltage at node ramp (240) will begin to rise again.

Unlike the generator (40), the generator (60) in accordance with the present invention comprises a latch circuit (74) coupled to the charge pump (70) as shown in FIG. 4. The latch circuit (74) comprises a pair of latches (232, 234), an AND gate (236), and an OR gate (238). In this embodiment, the latches (232, 234) are SR latches. The up_down_ctrl signal (246), is gated through the AND and OR gates (236, 238). The control signals for these gates (236, 238), up_pumpc (248) and dn_pump (250), come from the SR latches (232, 234). On each clock cycle, both latches (232, 234) are reset to the "blocking state" by the clearc signal (256), where the AND and OR gates (236, 238) block the up_pumpc (248) and dn_pump (250) signals. The OR gate (238) is capable of transmitting the up_pumpc signal (248). The AND gate (236) is capable of transmitting the dn_pump signal (250). In this embodiment, the transmission of the up_pumpc signal (248) is handled internally by the generator (60).

When the clearc signal (256) goes off, the up_down_ctrl signal (252) will not be transmitted to either the AND gate (236) nor the OR gate (238). The up_pumpc signal (248) is only transmitted if the comp_out signal (242) goes high during a clock cycle. Thus, the charge pump (70) will be held just below the threshold at which the pulse will reappear. The dn_pump signal (250) is enabled only if the pulse width is less than the maximum. The dn_pump signal (250) is controlled by the x2 signal (254). The x2 signal (254) going low during the clock cycle will allow the dn_pump signal (250) to pass. The x2 signal (254) goes low if the comp_out signal (258) comes high while the dischg signal (244) is still high. Thus, the dn_pump signal (250) is only transmitted if the comp_out signal (242) goes low during a clock cycle. If the clock pulse is already full width, then no more of the dn_pump signal (250) is allowed to pass, and the charge pump (70) will not pump down any further.

Figure 6:
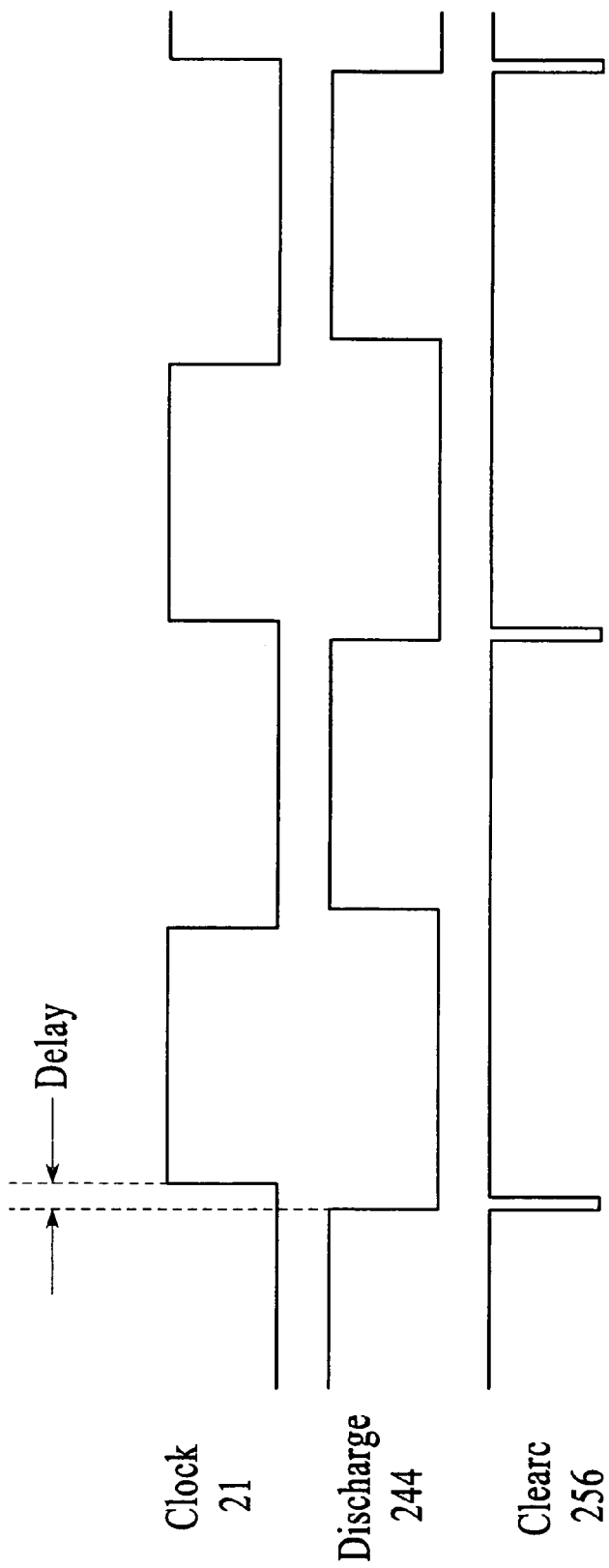
FIG. 6 illustrates a timing diagram for the PWM regulator in accordance with the present invention.

FIG. 6 illustrates a timing diagram for the PWM regulator in accordance with the present invention. The relative delays between the clock signal (21), the dischg signal (244), and the clearc signal (256) are exaggerated for the purpose of illustration. Importantly, there is a delay between the dischg signal (244) going low and the clock signal (21) going high. This is because the variable delay generator (60), even when running at maximum speed, requires a finite time to go high. In order for the dischg signal (244) to go from the last 1% of the signal to 0%, it is necessary to delay the rising edge of the clock signal (21) by a small amount since the up_pumpc signal (248) can be enabled with a very small pulse. Without this delay, the regulator (20) would still go to a saturated condition.

Thus, the latch circuit (74) keeps the charge pump (70) adjusted within the limits of its control. Once the regulator (20) nears either the overshoot or undershoot conditions, further signals to the charge pump (70) are blocked and C2 (224) stays at its limit. In addition, if the voltage, temperature, frequency or processing of the regulator (20) causes the limits to change, the latching circuit (74) adapts. In this manner, overshoot and undershoot conditions are minimized in the automatically adjusting PWM regulator (20) in accordance with the present invention.

Figure 5:
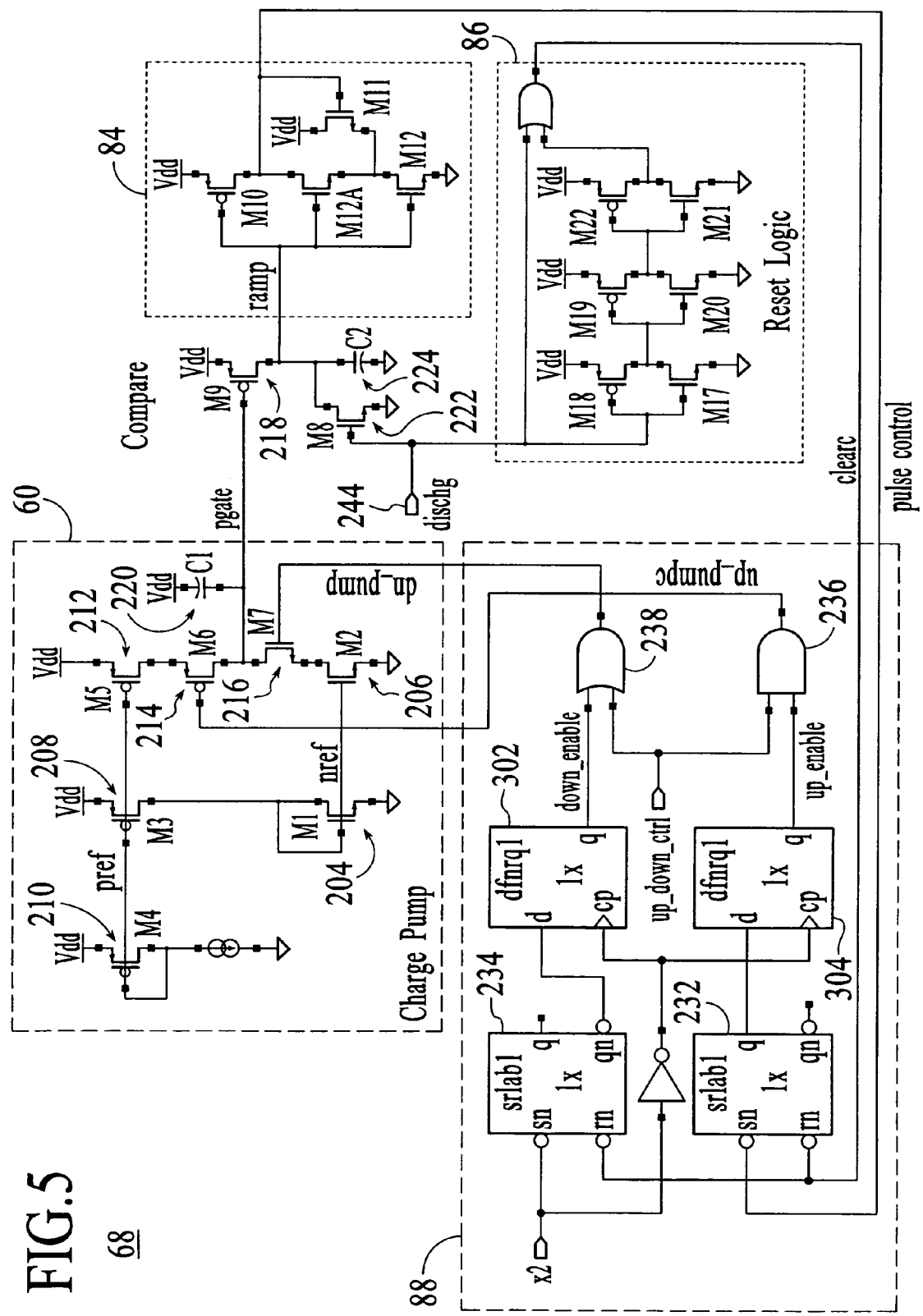
FIG. 5 illustrates an alternative embodiment of the variable delay generator of the PWM regulator in accordance with the present invention.

FIG. 5 illustrates an alternative embodiment of the variable delay generator of the PWM regulator in accordance with the present invention. This generator (68) comprises a charge pump (80), a voltage comparator circuit (84), and a latch circuit (88). The charge pump (80) of generator (68) functions similarly to the charge pump (70) of generator (60).

The latch circuit (88) of generator (68) is similar to the latch circuit (74) of generator (60) in that it comprises the SR latches (232, 234), the AND gate (236), and the OR gate (238). However, unlike the latch circuit (74), the latch circuit (88) also includes a pair of D flip-flops (302, 304) to enable signals connected to the AND and OR gates (236, 238). The D flip-flops (302, 304) correct a timing issue with the SR latches (232, 234), where resetting of the SR latches (232, 234) without the D flip-flops (302, 304) may cause a glitch in the control signals, up_pumpc (248) and dn_pump (250).

The voltage comparator circuit (84) of generator (68) is similar to the voltage comparator circuit (72) of generator (60) in that it comprises the clock circuit represented by transistor M9 (222), a transistor M8 (218), and a capacitor C2 (224). However, unlike the voltage comparator circuit (72) of generator (60), the voltage comparator circuit (84) of generator (68) comprises an inverter instead of the comparator (226, 228). Because the generator (68) is self-adjusting, it is not necessary to include a complex comparator and voltage reference circuit. The inverter is adequate to provide the comparison function. The charge pump (80) will adjust to compensate for changes in the inverter trip point due to voltage, temperature or process. Hysteresis is added to the inverter via transistors M11 and M12A to prevent oscillations on the detection.

Also, unlike the voltage comparator circuit (72) of generator (60), the voltage comparator circuit (84) of generator (68) comprises a pulse generator (86) coupled to the dischg signal (244) to reset the SR latches (232, 234) once per cycle. This obviates the need for providing a separate, synchronized pulse.

Figure 2:
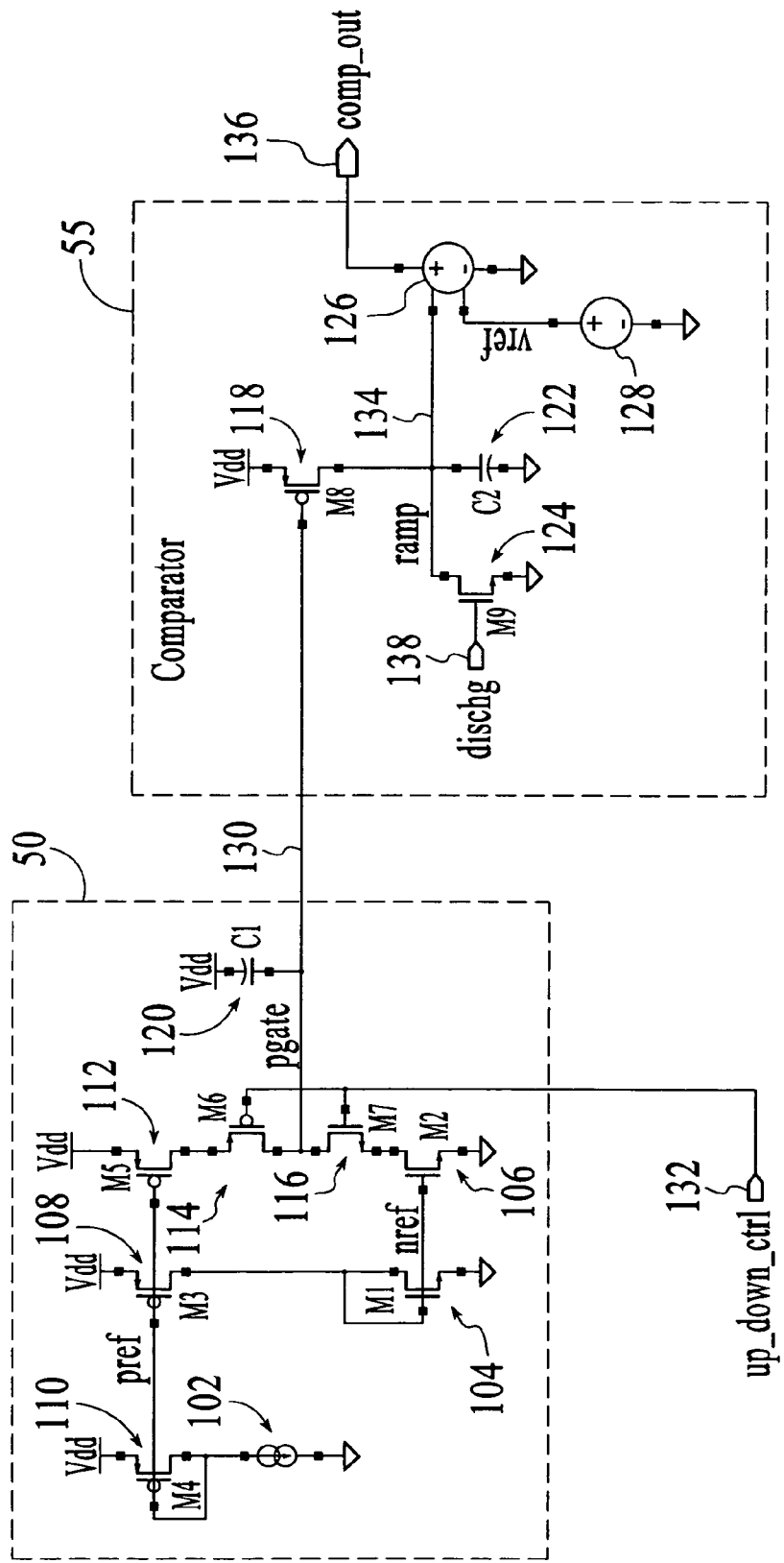
FIG. 2 illustrates a variable delay generator of the conventional PWM regulator.
Figure 7:
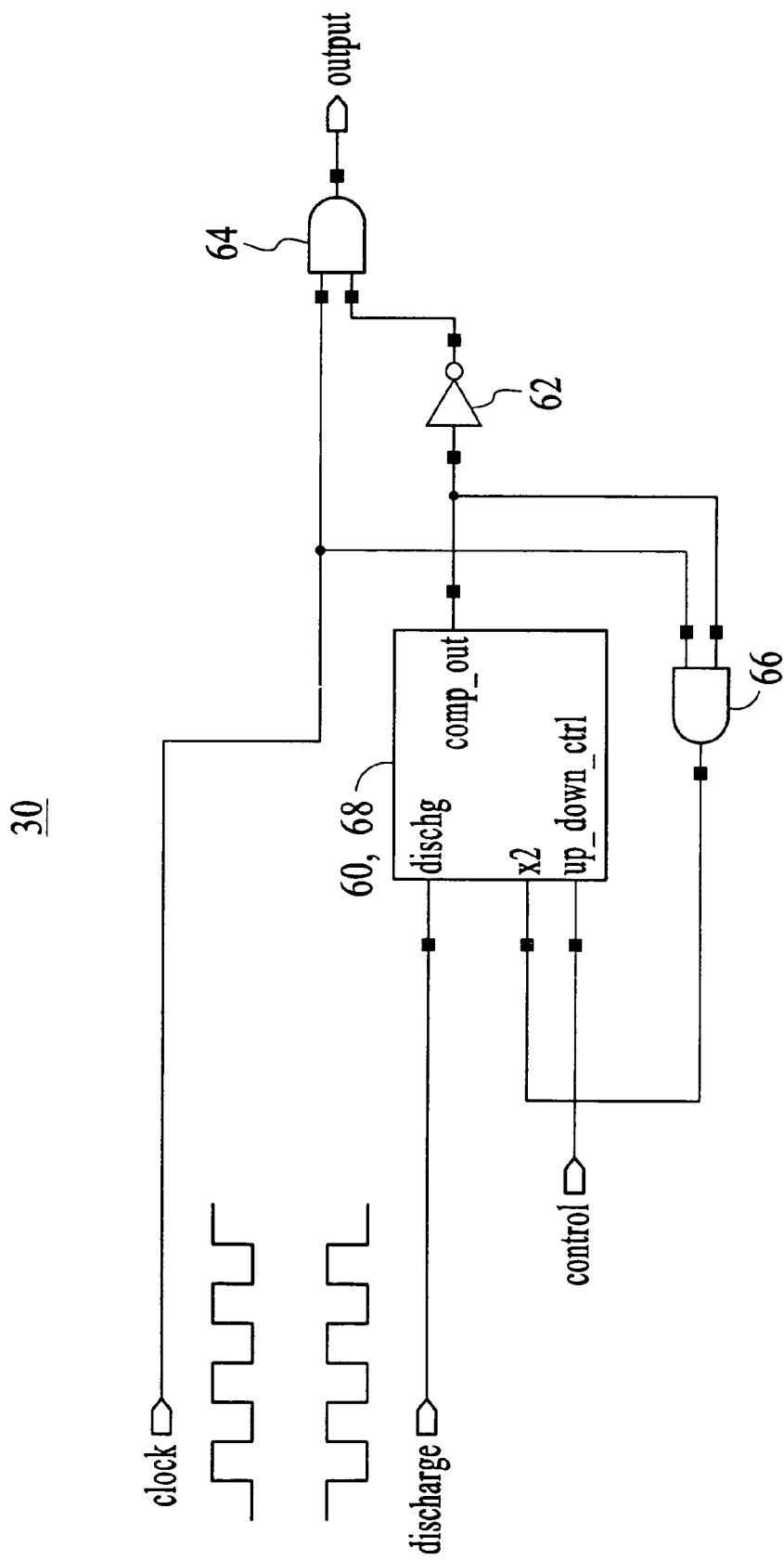
FIG. 7 illustrates an alternative embodiment of the PWM regulator in accordance with the present invention.

FIG. 7 illustrates an alternative embodiment of the PWM regulator in accordance with the present invention. This PWM regulator 30 is the same as the PWM regulator 20 (FIG. 2), except the clearc signal (256) is internally generated, so a separate input signal is no longer required.

Although the embodiments of the PWM regulator in accordance with the present invention are described above produces 50% modulation control, one of ordinary skill in the art will understand that other amounts of modulation control can also be produced without departing from the spirit and scope of the present invention.

Figure 8:
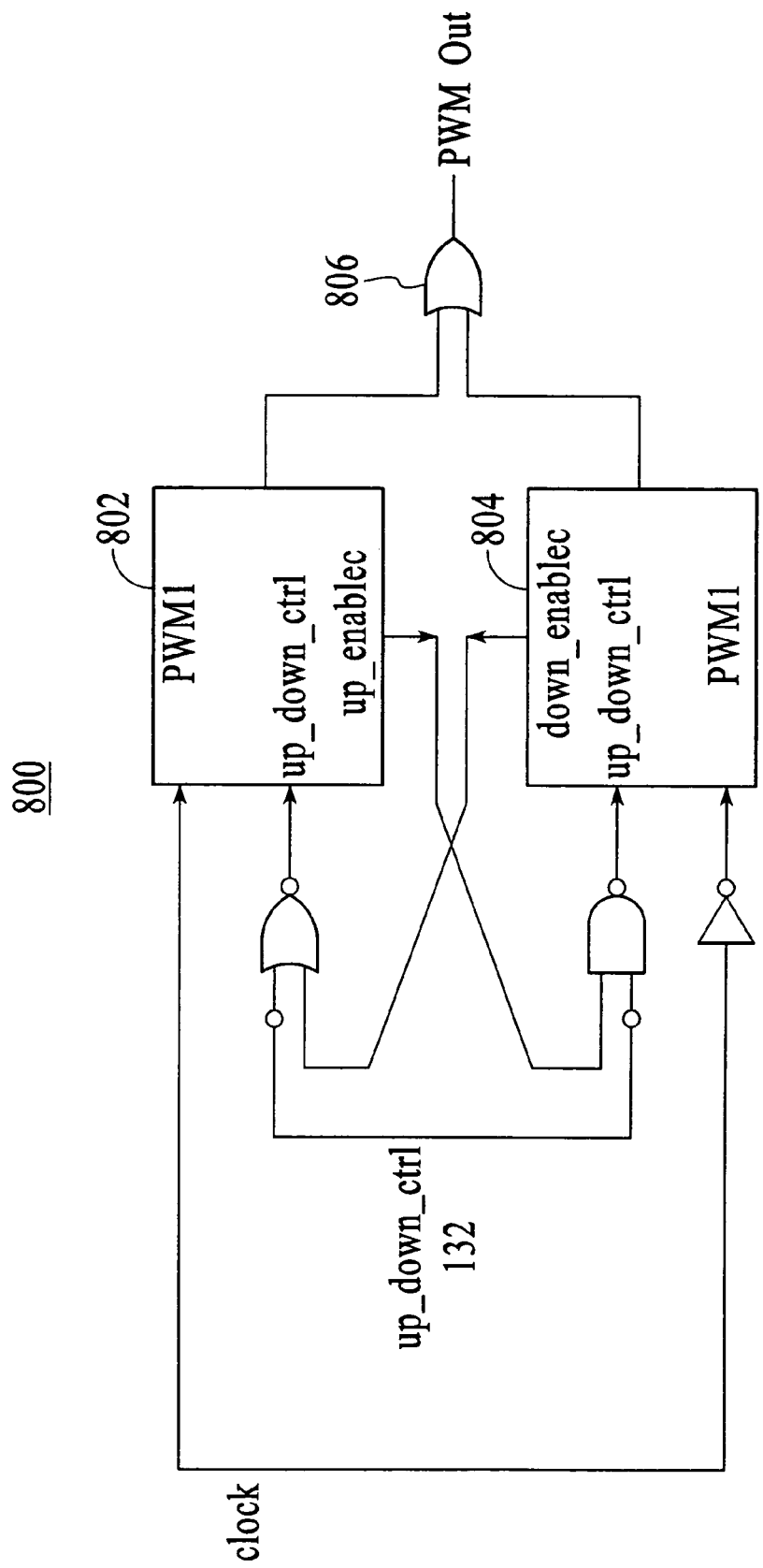
FIG. 8 illustrates an embodiment of the PWM regulator in accordance with the present invention that produces 0–100 modulation control.

For example, FIG. 8 illustrates an embodiment of the PWM regulator in accordance with the present invention that produces 0–100% modulation control. The PWM regulator (800) comprises two controllers, PWM1 (802) and PWM2 (804). Both PWM1 (802) and PWM2 (804) are connected to the same clock signal, but the input to PWM2 (804) is inverted. PWM1 (802) controls the pulse width of the positive half of the clock signal, and PWM2 (804) controls the negative half. The output of PWM2 (804) is inverted. The output of the two controllers (802 and 804) traverse an OR gate (806) to produce a signal that can be high at all times, i.e., 100% modulation control.

In this embodiment, the up_down_ctrl signal (132) must be separately controlled in each controller (802 and 804). When the up_down_ctrl signal (132) is high, the pulse width is decreased. When it is low, the pulse width is increased. For a 100% modulation scheme, it is important that PWM1 (802) increases its pulse width fully, i.e., to 50%, before PWM2 (804) starts passing its half pulse. Similarly, PWM2 (804) must decrease its pulse width fully, i.e., to 0%, before PWM1 (802) is allowed to start decreasing its pulse. The cross connection illustrated accomplishes this. The up_enablec signal and the down_enable signals (also illustrated in FIG. 5) are transmitted as illustrated. If the up_enablec signal from PWM1 (802) is low, indicating that the pulse width from PWM 1 (802) is not yet up to 100%, the up_down_ctrl signal (132) to PWM2 (804) is held high, forcing PWM2 (804) to stay at 0%. If the down_enable signal from PWM2 (804) is high, indicating the pulse width from PWM2 (804) is not yet down to 0%, the up_down_ctrl signal (132) to PWM1 (802) is held low, and PWM 1(802) is held at its maximum (50%) modulation. Thus, a user would present an up_down_ctrl signal (132) from outside the regulator 800 and would see a pulse width at the output that varies between 0% and 100%.

A self-adjusting PWM regulator which minimizes undershoot and overshoot conditions has been disclosed. The regulator in accordance with the present invention includes a latch circuit comprising a pair of SR latches coupled to a pair of AND/OR gates, which keep a charge pump adjusted within the limits of its control. In this manner, overshoot and undershoot conditions are minimized. In addition, the latch circuit self-adjusts to changes in voltage, temperature, frequency or processing of the regulator. Complex digital signal processing operations or exotic analog design techniques are not required.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A pulse width modulation regulator, comprising:
   a first controller, wherein the first controller receives as input a clock signal and a first control signal and outputs a first pulse width modulator signal and a first enable signal;
   a second controller, wherein the second controller receives as input an inverse of the clock signal and a second control signal and outputs a second pulse width modulated signal and a second enable signal;
   wherein the first enable signal maintains the second pulse width modulated signal at first state when the first pulse width modulated signal has not increased to a desired pulse width,
   wherein the second enable signal maintains the first pulse width modulated signal at a second state when the second pulse width modulated signal has not decreased to the desired pulse width; and
   an OR gate for receiving as input the first and second pulse width modulated signals and for providing an output signal.

2. The regulator of claim 1, wherein at least the first or the second controller comprises:
- a charge pump;
- a comparator circuit coupled to the charge pump, the comparator circuit for providing a pulse width modulated signal; and
- a latch circuit coupled to the charge pump for ensuring that the charge pump is adjusted such that an undershoot condition and an overshoot condition of the pulse width modulated signal is minimized.

3. The regulator of claim 2, wherein an input of the comparator circuit comprises an output of the charge pump.

4. The regulator of claim 2, wherein an input of the latch circuit comprises the pulse width modulated signal.

5. The regulator of claim 4, wherein the latch circuit transmits a first latch signal to the charge pump when the pulse width modulated signal is in a high state, wherein the first latch signal prevents the overshoot condition.

6. The regulator of claim 5, wherein the first latch signal prevents the output of the charge pump from increasing further.

7. The regulator of claim 4, wherein the latch circuit transmits a second latch signal to the charge pump when the pulse width modulated voltage is in a low state, wherein the second latch signal prevents the undershoot condition.

8. The regulator of claim 7, wherein the second latch signal prevents the output of the charge pump from decreasing further.

9. The regulator of claim 2, wherein the latch circuit comprises:
- a first SR latch;
- a second SR latch, wherein an input of the second SR latch comprises the pulse width modulated signal;
- a first gate, wherein an input of the first gate comprises an output from the second SR latch and an input signal, wherein an output of the first gate comprises a first latch signal to the charge pump, wherein the first latch signal prevents the overshoot condition; and
- a second gate, wherein an input of the second gate comprises an output from the first SR latch and the input signal, wherein an output of the second gate comprise a second latch signal to the charge pump, wherein the second latch signal prevents the undershoot condition.

10. The regulator of claim 9, wherein the latch circuit further comprises:
- a first D flip-flop coupled between the first SR latch and the second gate; and
- a second D flip-flop coupled between the second SR latch and the first gate.

11. The regulator of claim 2, wherein the comparator circuit comprises:
- a clock circuit; and
- an inverter coupled to an output of the clock circuit.

12. The regulator of claim 2, wherein the comparator circuit comprises:
- a clock circuit; and
- a pulse generator coupled to an input of the clock circuit.

13. A pulse width modulation regulator, comprising:
- a first controller, wherein the first controller receives as input a clock signal and a first control signal and outputs a first pulse width modulator signal and a first enable signal;
- a second controller, wherein the second controller receives as input an inverse of the clock signal and a second control signal and outputs a second pulse width modulated signal and a second enable signal;
- wherein the first enable signal maintains the second pulse width modulated signal at first state when the first pulse width modulated signal has not increased to a desired pulse width,
- wherein the second enable signal maintains the first pulse width modulated signal at a second state when the second pulse width modulated signal has not decreased to the desired pulse width; and
- an OR gate for receiving as input the first and second pulse width modulated signals and for providing an output signal,
- wherein at least the first or the second controller comprises:
  - a charge pump;
  - a comparator circuit coupled to the charge pump, the comparator circuit for providing a pulse width modulated signal; and
  - a latch circuit coupled to the charge pump for ensuring that the charge pump is adjusted such that an undershoot condition and an overshoot condition of the pulse width modulated signal is minimized.

* * * * *